United States Patent
Procházka et al.

(10) Patent No.: US 12,306,223 B2
(45) Date of Patent: May 20, 2025

(54) SENSOR ARCHITECTURE FOR CORRECTING THERMALLY-INDUCED LINEARITY ERROR

(71) Applicant: Allegro MicroSystems, LLC, Manchester, NH (US)

(72) Inventors: Roman Procházka, Struharov (CZ); Martin Drinovsky, Horomerice (CZ)

(73) Assignee: Allegro MicroSystems, LLC, Manchester, NH (US)

( * ) Notice: Subject to any disclaimer, the term of this patent is extended or adjusted under 35 U.S.C. 154(b) by 393 days.

(21) Appl. No.: 18/149,322

(22) Filed: Jan. 3, 2023

(65) Prior Publication Data

US 2024/0219438 A1    Jul. 4, 2024

(51) Int. Cl.
G01R 19/32 (2006.01)
G01R 15/20 (2006.01)

(52) U.S. Cl.
CPC .......... G01R 19/32 (2013.01); G01R 15/207 (2013.01)

(58) Field of Classification Search
CPC ...... G01R 19/32; G01R 15/207; G01R 15/20; G01R 15/205; G01R 33/00; G01R 33/09; G01R 33/02; G01R 19/00; G01R 19/0092; G01R 15/148; G01R 15/14; H01B 5/02; H02G 5/00

See application file for complete search history.

(56) References Cited

U.S. PATENT DOCUMENTS

| | | |
|---|---|---|
| 8,604,777 B2 | 12/2013 | Doogue et al. |
| 10,481,181 B2 | 11/2019 | Bussing et al. |
| 10,908,190 B2 | 2/2021 | Bussing et al. |
| 10,935,612 B2 | 3/2021 | Belin et al. |
| 11,346,894 B2 | 5/2022 | Belin |
| 11,567,108 B2 | 1/2023 | Messier |
| 2013/0015843 A1* | 1/2013 | Doogue ............... G01R 15/148 324/202 |
| 2014/0253103 A1 | 9/2014 | Racz et al. |
| 2020/0057120 A1* | 2/2020 | Belin ................... G01R 33/096 |

* cited by examiner

*Primary Examiner* — Son T Le
(74) *Attorney, Agent, or Firm* — Daly, Crowley, Mofford & Durkee, LLP

(57) ABSTRACT

A current sensor comprising: a substrate; a conductor that is disposed on or adjacent to the substrate; one or more sensing elements that are formed on the substrate, the one or more sensing elements being configured to generate one or more first signals in response to a magnetic field that is associated with the conductor; and electronic circuitry that is formed on the substrate, the electronic circuitry being configured to generate a second signal based on the one or more first signals, the second signal being indicative of a level of electrical current through the conductor, wherein the electronic circuitry includes a first instance of a component, a second instance of the component, and mixing circuitry that is configured to mix an output of the first instance with an output of the second instance to produce a mixed signal.

25 Claims, 8 Drawing Sheets

US 12,306,223 B2

SENSOR ARCHITECTURE FOR CORRECTING THERMALLY-INDUCED LINEARITY ERROR

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, a current sensor is provided comprising: a substrate; a conductor that is disposed on or adjacent to the substrate; one or more sensing elements that are formed on the substrate, the one or more sensing elements being configured to generate one or more first signals in response to a magnetic field that is associated with the conductor; and electronic circuitry that is formed on the substrate, the electronic circuitry being configured to generate a second signal based on the one or more first signals, the second signal being indicative of a level of electrical current through the conductor, wherein the electronic circuitry includes a first instance of a component, a second instance of the component, and mixing circuitry that is configured to mix an output of the first instance with an output of the second instance to produce a mixed signal, the mixing circuitry being arranged to provide the mixed signal to at least one of the sensing elements or a second component of the electronic circuitry, and wherein the first instance of the component is formed in a first portion of the substrate that is adjacent to the conductor and the second instance of the component is formed in a second portion of the substrate that is situated further apart from the conductor than the first portion.

According to aspects of the disclosure, a current sensor is provided comprising: a substrate; a conductor that is disposed on or adjacent to the substrate; one or more sensing elements that are formed on the substrate, the one or more sensing elements configured to generate one or more first signals in response to a magnetic field that is associated with the conductor; and electronic circuitry that is formed on the substrate, the electronic circuitry being configured to generate a second signal based on the one or more first signals, the second signal being indicative of a level of electrical current through the conductor, wherein the electronic circuitry includes a first instance of a component, a second instance of the component, and the electronic circuitry is configured to mix an output of the first instance with an output of the second instance to produce a mixed signal and use the mixed signal in generating the second signal.

According to aspects of the disclosure, a current sensor is provided comprising: a substrate that is subjected to a temperature gradient during operation of the sensor; one or more sensing elements that are formed on the substrate, the one or more sensing elements configured to generate one or more first signals in response to a stimulus; and electronic circuitry that is formed on the substrate, the electronic circuitry being configured to generate a second signal based on the one or more first signals, the second signal being indicative of a level of the stimulus, wherein the electronic circuitry includes a first instance of a component, a second instance of the component, and the electronic circuitry is configured to mix an output of the first instance with an output of the second instance to produce a mixed signal and use the mixed signal in generating the second signal.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Figure 2:
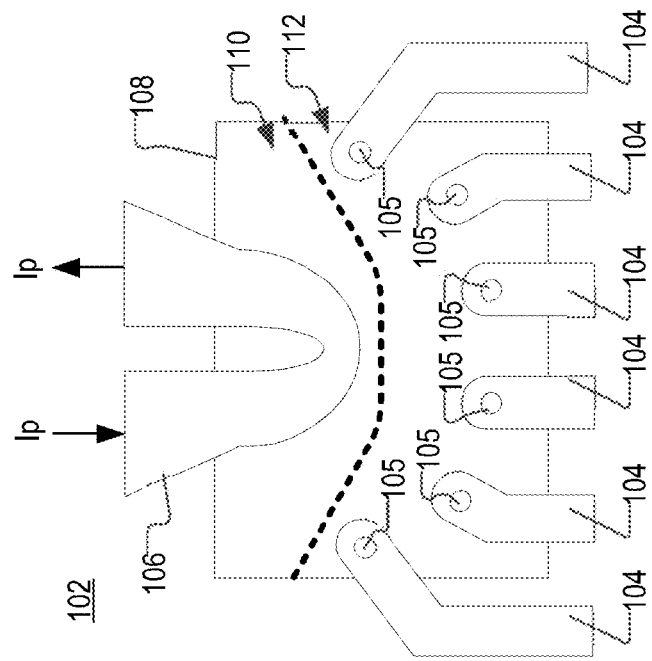
FIG. 2 is a planar top-down view of the current sensor of FIG. 1, according to aspects of the disclosure.
Figure 1:
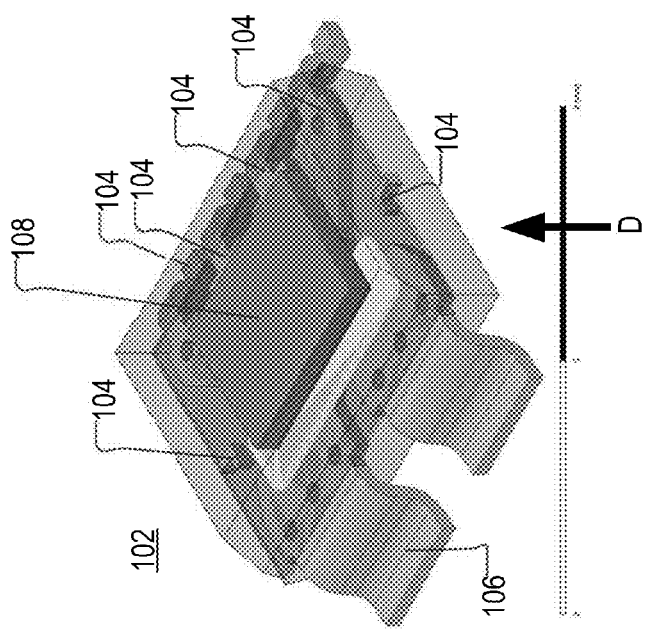
FIG. 1 is a perspective view of an example of a current sensor, according to aspects of the disclosure.

FIGS. 1-2 show an example of a current sensor 102, according to aspects of the disclosure. As illustrated, the sensor 102 may include low voltage terminals 104, a busbar 106, and a sensor die 108. The busbar 106 may be disposed underneath the sensor die 108, and the low voltage terminals 104 may be coupled to different traces on the sensor die 108 via respective solder bumps 105. The sensor die 108 may have one or more magnetic field sensing elements formed thereon as well as other electronic circuitry for processing the signals that are generated by the magnetic field sensors. In operation, the magnetic field sensor may be configured to detect a magnetic field that is produced as a result of electrical current Ip running through the busbar 106, and the electronic circuitry may process the signals to generate an output signal, which is indicative of the level of electrical current Ip through the busbar 106. Under the nomenclature of the present disclosure, the busbar 106 may also be referred to as a "leadframe", "IP loop", "a primary conductor," or a "conductor". Although in the example of FIGS. 1-2, the busbar 106 is implemented separately of the sensor die 108 and packaged together with the sensor die 108 in the same semiconductor package, alternative implementations are possible in which the busbar 108 is formed directly on the sensor die 108 (e.g., as one or more conductive traces) or provided separately of the sensor package. For example, in some instances, the busbar 106 may be external to the package of sensor 102 and the sensor 102 may be disposed over the busbar 106.

According to the present disclosure, it has been determined that current sensors, such as the sensor 102, may experience an effect that is herein referred to as "Thermally-Induced Linearity Error (TILE)". In particular, it has been discovered that current sensor sensitivity shows TILE during long-term current pulses (usually pulses that last 2 seconds or longer). TILE depends on the power dissipation of an in-package busbar (such as the busbar 106), which causes an increase in die temperature, as well as an increase in thermal drift (i.e., thermal gradient) across the sensor die. In other words, TILE may be a linearity error that is caused by a thermal gradient across the sensor die. The magnitude of TILE may depend on PCB design (e.g., copper thickness, number of layers, via quantity, and location). Under the nomenclature of the present disclosure, the term "TILE" may also be referred to as "sensitivity error" or "sensitivity error that is at least in part caused by the presence of a thermal gradient across a sensor die".

Some sensor packages, especially flip-chip packages, show a higher thermal gradient during long current pulses. The sensor die of such sensors is heated by the built-in busbar (usually under one half of the chip) and on the other half of the chip there can be solder bumps, such as the solder bumps 105, which work as a heat sink. So, in a current sensor, with a built-in busbar, one half of the die may heat-up and the other half may sink the heat out, thus causing a thermal gradient to form across the sensor die.

Figure 3:
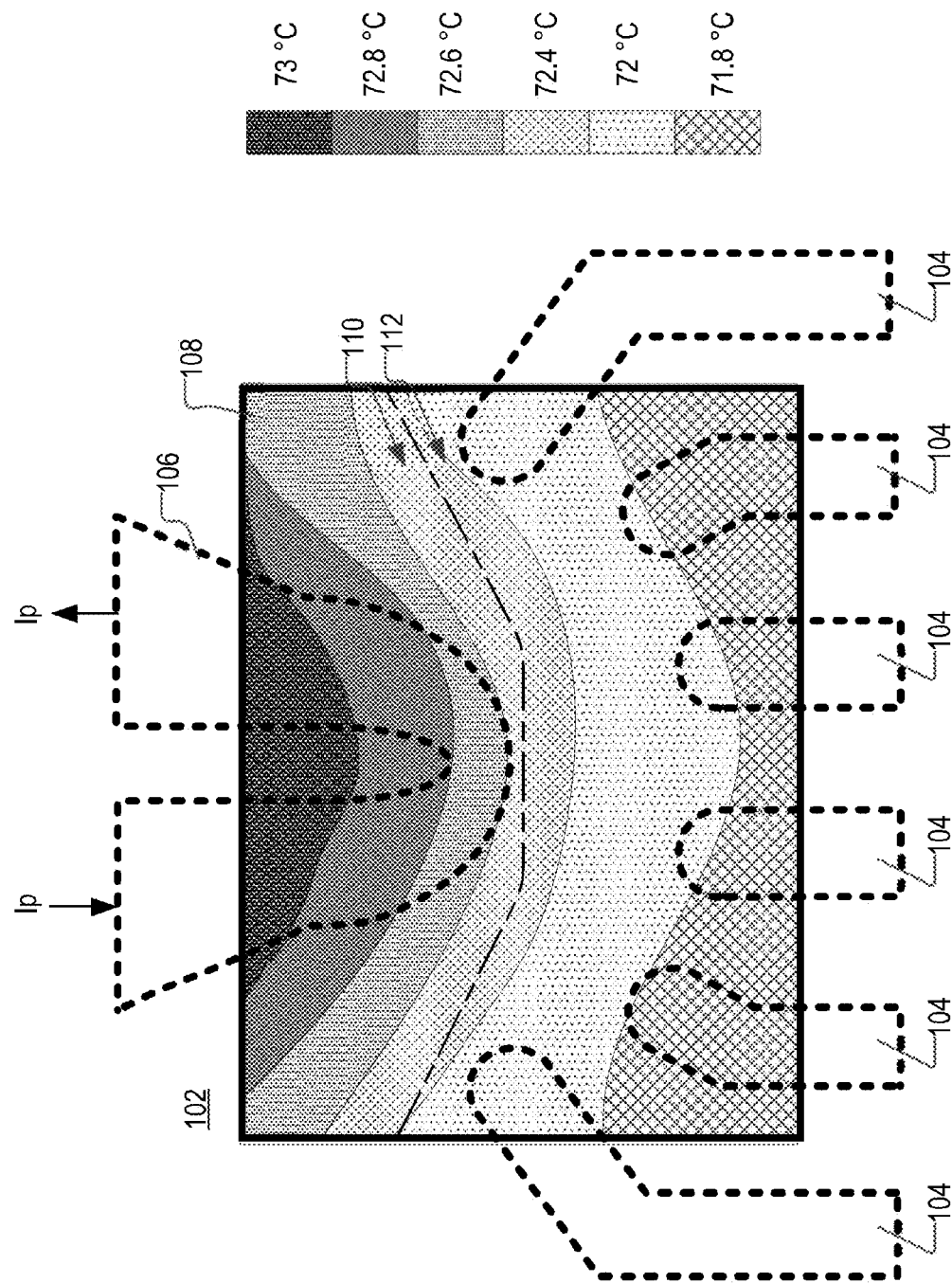
FIG. 3 is a heatmap of a current sensor of FIG. 1, according to aspects of the disclosure.

FIG. 3 shows a heat map of the sensor 102, according to aspects of the disclosure. The heat map shows the temperature of sensor die 108 during long current pulses through the busbar 106. The heat map shows that a portion 110 of the sensor die 108, which is adjacent to the busbar 106 may have a higher operating temperature than a portion 112 of the sensor die 108. Portion 112, as illustrated, is situated further apart from the busbar 106 than portion 110. In another aspect, the heat map shows the thermal gradient that can be formed across the sensor die 108. As illustrated, portions that are closer to the busbar 106 tend to be warmer than portions of the sensor die 108 that are further away from the busbar 106. As discussed above, the thermal gradient may be the product of the busbar 106 generating heat when a long pulse of current is passed through the busbar 106, and the solder bumps 105 dissipating the heat from the other end of the sensor die 108. As noted above, the presence of a thermal gradient across the sensor die 108 may give rise to TILE in the sensor 102.

Figure 4:
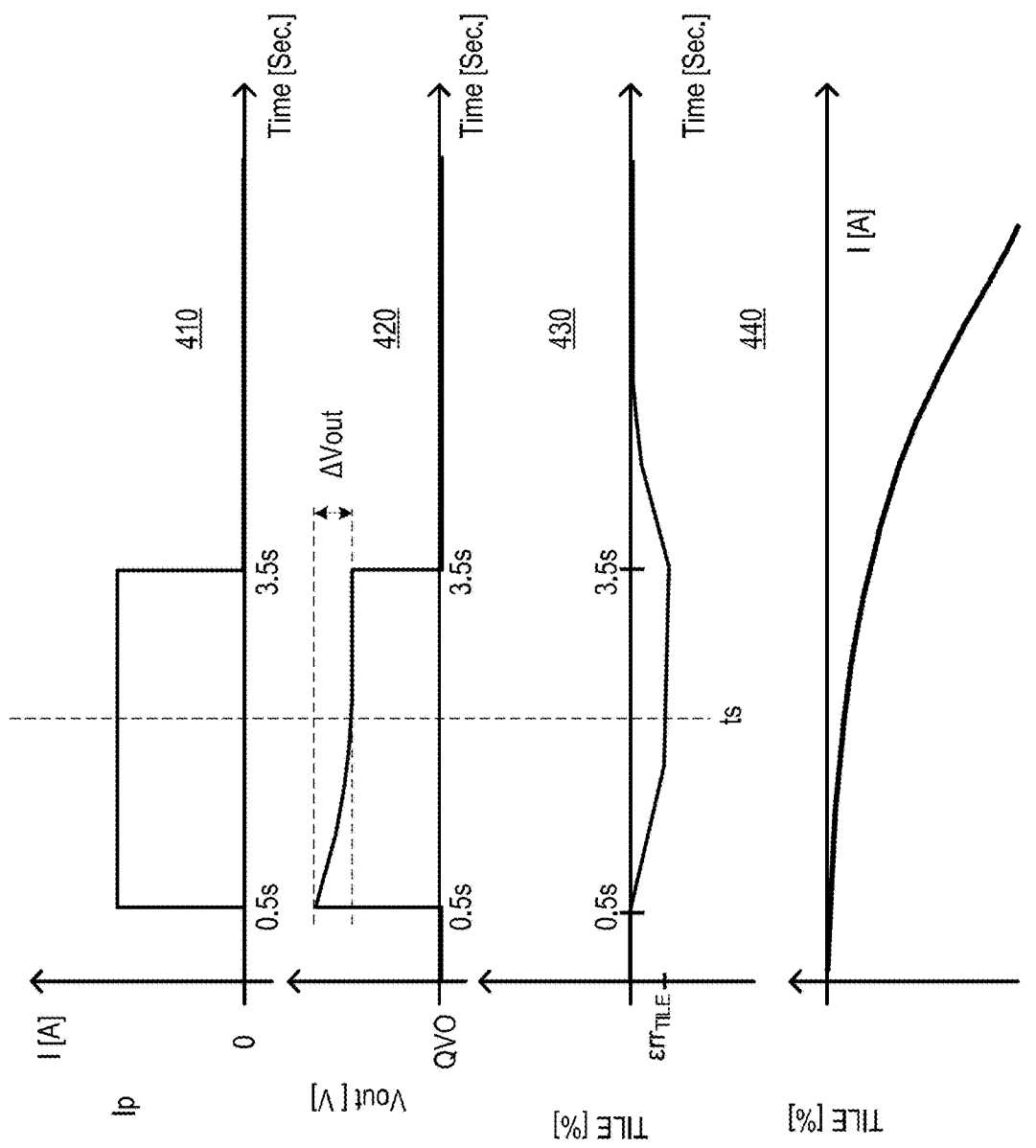
FIG. 4 shows graphs illustrating aspects of the operation of the current sensor of FIG. 1, according to aspects of the disclosure.

FIG. 4 shows plots 410-440, which characterize the operation of the sensor 102, as well as the appearance of TILE in the sensor 102 when the long pulses of electrical current are passed through the busbar 106. Specifically, plots 410-440 show the correlation between the duration of a current pulse through the busbar 106, the output Vout of the sensor 102, the amount of TILE in the sensor 102, and the relationship between TILE and the level of electrical current through the busbar 106.

Plot 410 shows a graph of the electrical current Ip through the busbar 106 versus time. Specifically, plot 410 shows a single pulse of the electrical current Ip that is passed through the busbar 106. According to the present example, the pulse has a duration of 3 seconds—however, the present disclosure is not limited thereto. The thermal gradient across the sensor die 108 would increase progressively for the duration of the pulse, and, at the end of the pulse, portion 110 of the sensor die 108 would be at its hottest (for the duration of the pulse).

Plot 420, shows a graph of an output signal Vout that is output from the sensor 102. According to the example of FIG. 4, the output signal Vout may be any digital or analog signal that is at least in part indicative of the level of the electrical current Ip through the busbar 106. The output signal Vout may be generated based on one or more signals that are produced by magnetic field sensing elements formed on the sensor die 108. The one or more signals may be generated in response to a magnetic field that is associated with the busbar 106. The magnetic field may be generated as a result of an electrical current running through the busbar 106. As illustrated, the level of signal Vout may decrease by ΔVout over the duration of the current pulse (shown in plot 410). Although not shown in plot 420, in implementations in which the physical arrangement of the elements of sensor 102 results in opposite TILE, the signal Vout may increase over the duration of the current pulse. In another aspect, plot 420 shows that the signal Vout may settle at a constant value by time ts, following a predetermining settling period. According to the example of FIG. 4, the signal Vout is output by the sensor 102 to an external device. However, alternative implementations are possible in which the signal Vout is used internally by one or more components of the sensor 102.

Plot 430 shows a graph of the sensitivity error of the sensor 102. As illustrated, the sensitivity error progressively increases from the beginning of the current pulse, until it sets at the value of $err_{TILE}$. In one respect, plot 430 shows that for very short pulses of the electrical current Ip, the TILE of the sensor 102 would be comparatively small than for pulses with a prolonged duration.

Plot 440 shows a graph of the sensitivity error of the sensor 102 as a function of the level of the electrical current Ip. In one respect, plot 440 shows that the TILE of the sensor 102 is proportional to the square of the value of electrical current Ip. Based on the physical arrangement of the sensor components in conjunction with components temperature based on the heat map, TILE may decrease (as shown on plot 440) or increase with the busbar current I.

In general, a current sensor may have a plurality of components, which together form a signal path. Such components may include one or more of: (i) magnetic field sensing element(s), (ii) a current source for the magnetic field sensing elements, (iii) an active temperature compensation circuit, (iv) an offset control circuit, (iv) a dynamic offset cancellation circuit, (v) signal amplifier(s), (vi) filter(s), and/or any other suitable type of component. Each of the components of the signal path may be formed at a different location in the sensor die of the current sensor.

A mathematical model based on a $1^{st}$ order temperature coefficient (TC) is now provided that can be used to describe aspects of TILE, but higher order polynomial model or any other temperature compensation function may be used instead when needed. In general, the impact of some components in a signal path on the sensitivity of the signal path may be directly or inversely proportional to the component's value. (E.g., see the signals paths shown in FIGS. 5 and 6, etc.) Let us call $A_i$ the components that have a directly proportional impact on the sensitivity of a signal path. Let us call $B_j$ the components that have an inversely proportional impact on the sensitivity of the signal path. The sensitivity of the signal path may then be described by Equation 1.

$$\text{Sensitivity} = \frac{\prod_{i=1}^{n} A_i}{\prod_{j=1}^{m} B_j} \quad (1)$$

where i is a component index (e.g., a positive integer), j is a component index (e.g., a positive integer), $A_i$ is a first type of component which has a directly proportional impact on the sensitivity of the signal path, $B_j$ is a second type of component which has an inversely proportional impact on the sensitivity of the signal path, n is a total count of components from the first type, and m is a total count of components from the second type. As discussed with respect to Equations 1-10, the value of $A_i$ is the gain of the signal that is output by component $A_i$. Similarly, the value of $B_i$ is equal to 1/gain of the signal that is output by component $B_i$ (i.e., one over the gain that is output by component $B_i$).

As noted above, each component $A_i$ and/or $B_j$ can increase or decrease its value with increasing temperature or it can be constant with respect to the temperature. If any signal path component increases its value with temperature, it has a positive TC; if any of the signal path component decreases its value with temperature it has negative TC; if any of the signal path component is constant with respect to temperature, its TC is 0. In other words, the temperature coefficient $TC_{Ai}$ models the changes in the value of $A_i$ which result from changes in the temperature of $A_i$. And the temperature coefficient $TC_{Bi}$ models the changes in the value of $B_i$ which results from changes in the temperature of $A_i$.

Equation 2 describes the relationship between the sensitivity of a signal path and temperature:

$$\text{Sensitivity}(T) = \frac{\prod_{i=1}^{n} A_i(T)}{\prod_{j=1}^{m} B_j(T)} \quad (2)$$

Equation 3 describes the relationship between average die temperature T and temperature increase above nominal temperature:

$$T = (T_0 + \Delta T) \quad (3)$$

where $T_0$ is a nominal sensor temperature, $\Delta T$ is temperature increase or decrease relative to $T_0$. The nominal sensor temperature $T_0$ may also be referred to as the "optimal sensor temperature".

Equation 4 describes the value of $A_i$ as a function of T:

$$A_i(T) = A_{i0} \cdot (1 + TC_{Ai} \cdot (T_0 + \Delta T)) \quad (4)$$

Equation 5 describes the value of $B_j$ as a function of T:

$$B_j(T) = B_{j0} \cdot (1 + TC_{Bj} \cdot (T_0 + \Delta T)) \quad (5)$$

where $A_{i0}$ is nominal value of the i-th component $A_i$ ($A_{i0}=A_i(T_0)$), $B_{j0}$ is nominal value of the j-th component $B_j$ ($B_{j0}=B_j(T_0)$), $TC_{Ai}$ is the temperature coefficient of component $A_i$, $TC_{Bj}$ is the temperature coefficient of $B_j$.

A signal path within a sensor may be temperature-compensated for the ideal case where all portions of the signal path are at the same temperature. The temperature compensation in a signal path may be described by equation 6 below:

$$TC_{\text{Sensitivity}} \cong TC_{A1} + \ldots TC_{An} - TC_{B1} - \ldots TC_{Bm} \quad (6)$$

where $TC_{\text{Sensitivity}}$ is a temperature coefficient that adjusts the gain and/or offset of a signal to correct for an increase or decrease of the gain and/or offset of the signal due to temperature, and where n is a first component index (e.g., a positive integer), m is a second component index (e.g., a positive integer), $TC_{An}$ is temperature coefficient of the n-th component in the sensor 102 whose sensitivity is proportional to temperature and $TC_{Bm}$ is temperature coefficient of the m-th component of the sensor 102 whose sensitivity is inversely proportional to temperature.

In some respects, Equation 6 assumes that the temperature of all components in a signal path is the same, and corrects for a deviation of the present temperature of the sensor 102 from an optimal temperature level. Under ideal circumstances, when no thermal gradient is present across the sensor die on which the components of the signal path are formed, using the same function TC to adjust the sensitivity of the signal path can be highly effective in countering the effects of temperature on sensitivity. This approach, however, is far less effective when a thermal gradient is present across the sensor die because each temperature-dependent component has a slightly different temperature.

When a thermal gradient is present across the sensor die, the temperature of each of components $A_i$ and $B_j$ may differ from the average die temperature T. This is represented by equation 7 below:

$$\text{Sensitivity}(T) = \frac{\prod_{i=1}^{n} A_{i0}(1 + TC_{Ai}(T_0 + \Delta T + \Delta T_{Ai}))}{\prod_{i=1}^{m} B_{j0}(1 + TC_{Bj}(T_0 + \Delta T + \Delta T_{Bj}))} \quad (7)$$

where $\Delta T_{Ai}$ is temperature difference between the die area where component $A_i$ is located and the average die temperature T, and $\Delta T_{Bj}$ is temperature difference between the die area where component $B_j$ is located and the average die temperature T. In some respects, Equation 7 provides that the sensitivity of the signal path depends on the extent to which the temperature of each component in the signal path deviates from the average temperature T of all components in the signal path.

The sensitivity error of a signal path may be described by equation 8 below:

$$err_{TILE} \cong \sum_{i=1}^{n} TC_{Ai} \cdot \Delta T_{Ai} - \sum_{j=1}^{m} TC_{Bj} \cdot \Delta T_{Bj} \quad (8)$$

where, $err_{TILE}$ is TILE or sensitivity error that is imparted on the sensor 102 by a thermal gradient that is present across the sensor die 108; $TC_{Ai}$ is the temperature coefficient of component $A_i$; $\Delta T_{Ai}$ is the temperature difference between the die area where component $A_i$ is located and the average die temperature T; $TC_{Bj}$ is temperature coefficient of component $B_j$; and $\Delta T_{Bj}$ is temperature difference between die area where component $B_j$ is located and average die temperature T.

When a sensor die is being developed the goal is to minimize $\text{err}_{TILE}$. Components $A_i$ and $B_j$ have to be placed in specific senor die areas in a way that causes the overall placement of components $A_i$ and $B_j$ to result in minimizing $\text{err}_{TILE}$ yields, achieved by respecting equation 9:

$$\sum_{i=1}^{n} TC_{Ai} \cdot \Delta T_{Ai} = \sum_{j=1}^{m} TC_{Bj} \cdot \Delta T_{Bj} \qquad (9)$$

Minimizing $\text{err}_{TILE}$ is usually a difficult task because $\Delta T_{Ai}$, $\Delta T_{Bj}$ values are known after physical placement of the $A_i$ and $B_j$ components on the sensor die layout. Furthermore $\Delta T_{Ai}$, $\Delta T_{Bj}$ depends on the heat map (FIG. 3) which may be influenced by a number of factors, such as PCB layout, number of layers in the PCB, whether or not thermal vias are present in the PCB or sensor die, etc. which further compounds to the difficulty of minimizing $\text{err}_{TILE}$.

The implications of TILE on sensor design are now described in further detail. In general, when a sensor is designed, a layout of the sensor is prepared by engineers. The layout specifies the position of different components on the sensor die, as well as the connectivity between different components. The preparation of a sensor layout is generally time-consuming and costly. In conventional sensor designs, the effects of TILE on the sensor cannot be determined until the layout is completed and simulation (or perhaps even physical testing) is carried out on the layout. Furthermore, thermal simulation of sensor packages has limited accuracy, so the results of any simulation may lack sufficient precision. And still furthermore, if a sensor layout is found to have a poor TILE performance, the layout would need to be revised, which may require significant time, and may significantly add to the overall cost of preparing the layout. Such revisions would need to be performed in a trial-and-error manner, until a layout is arrived upon that has satisfactory TILE performance, which could make it even harder to predict the end cost of layout preparation.

For this reason, the need exists for a sensor architecture that does not require layout revisions in the event of poor TILE performance. As is discussed further below, the present disclosure addresses this need by providing examples of sensor architectures that do not require layout re-design in the event of poor TILE performance. Examples of such sensor architectures are discussed further below with respect to FIGS. 6-9.

Figure 5:
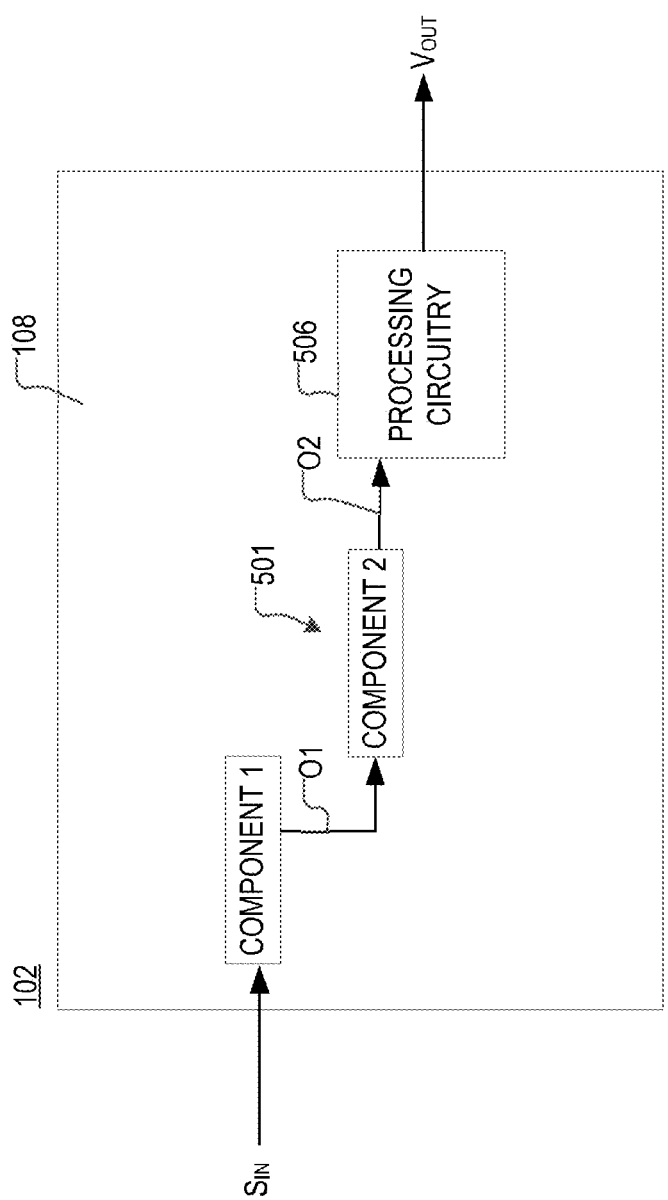
FIG. 5 is a diagram illustrating aspects of an example of a sensor architecture, according to aspects of the disclosure.

But firstly, an example of a conventional architecture for the sensor 102 is provided in FIG. 5. The conventional architecture would require layout revisions in the event of poor TILE performance. More specifically, in the example of FIG. 5, the sensor 102 includes a signal path 501. Signal path 501 may include a first component (hereinafter "component 1"), a second component (hereinafter "component 2"), and a processing circuitry 506. Component 1 is arranged to receive a signal Sn and generate a signal O1 based on the signal Sn. Component 2 is arranged to receive signal O1 and generate a signal O2 based on the signal O1. The processing circuitry 506 is configured to generate a signal Vout based on the signal O2. The processing circuitry 506 may include any suitable type of digital or analog circuitry. In some implementations, the processing circuitry 506 may include an application-specific circuit, an arithmetic and logic unit, a CORDIC processor, a general-purpose processor, a special-purpose processor, and/or any other suitable type of processing circuitry.

It will be readily appreciated that FIG. 5 provides a simplified view a sensor architecture, which omits many components that would normally be present in a current sensor. In the example of FIG. 5, component 1 may include an active temperature compensation circuit and component 2 may include an offset control circuit. The signal $S_{IN}$ may include any suitable type of signal that is generated, at least in part, by one or more magnetic field sensing elements that are part of the sensor 102. The signal Six may be generated by one or more magnetic field sensing elements in response to a magnetic field that is associated with the busbar 106. The signal Vout, as discussed, may be a signal that is at least in part indicative of the level of electrical current through the busbar 106.

Figure 6:
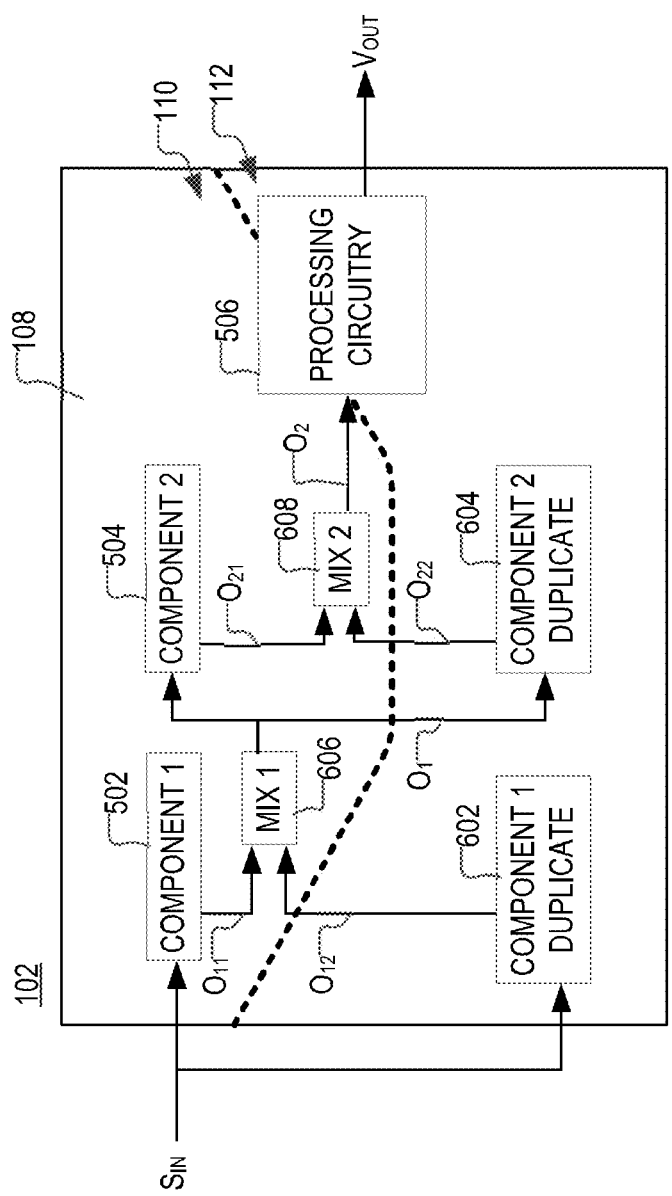
FIG. 6 is a diagram illustrating aspects of an example of a sensor architecture, according to aspects of the disclosure.

FIG. 6 is a schematic diagram of an improved architecture for the sensor 102, according to aspects of the disclosure. FIG. 6 is provided to illustrate an example of a sensor architecture that facilitates precise correction of TILE, without requiring experimentation with multiple sensor layouts. In the sensor architecture, one or more components of the sensor 102 that are susceptible to TILE are duplicated by placing multiple instances of each duplicated component at different locations on the sensor die 108. Afterwards, the outputs of each set of duplicated instances are mixed, and the mixed signal is treated as if it were produced by a single instance of the duplicated component.

Mixing the outputs of different instances of the same components includes calculating a weighted average of the two signals. The exact weights that are used in calculating the weighted average can be determined (e.g., through experimentation or simulation), after the layout of the sensor 102 is completed, which enables optimal correction of TILE to be achieved without changing the layout itself. In other words, the sensor architecture, an example of which is provided in FIG. 6, is advantageous because it does not require layout revisions in the event of poor TILE performance, but rather only revisions of the weights that are used to calculate the weighted average of the outputs of different instances of a duplicated component.

In the example of FIG. 6, component 1 and component 2 are duplicated. Specifically, the signal path 501 of the sensor 102 includes an instance 502 of component 1, an instance 602 of component 1, an instance 504 of component 2, an instance 604 of component 2, a mixer 606, a mixer 608, and the processing circuitry 506.

Instances 502 and 602 of component 1 are now described in further detail. In one example, instances 502 and 602 of component 1 may be identical electronic circuits. In another example, instances 502 and 602 of component 1 may be different electronic circuits that perform the same function—for example, instances 502 and 602 of component 1 may have the same (or similar) response functions, but be implemented differently (e.g., by using different types of components and/or different circuit layouts). In some implementations, each of instances 502 and 602 may include any suitable type of digital and/or analog circuitry. As noted above, in the present example, component 1 is an active temperature compensation circuit, and so instances 502 and 602 are different instances of a temperature compensation circuit. However, it will be understood that the present disclosure is not limited to duplicating any specific component of the sensor 102.

In some implementations, instances 502 and 602 of component 1 may be formed in portions of the sensor die 108 that have different operating temperatures. For example, in some implementations, instance 502 may be formed in portion 110 of the sensor die 108, and instance 602 may be formed in portion 112 of the sensor die 108. As a result of the placement of instances 502 and 602 at different locations on the sensor die 108, the sensitivity of instances 502 and 602 may be affected to a different extent by increases in temperature (or a thermal gradient) of the sensor die 108.

Instances 504 and 604 of component 2 are now described in further detail. In one example, instances 504 and 604 of component 2 may be identical electronic circuits. In another example, instances 504 and 604 of component 2 may be different electronic circuits that perform the same function—for example, instances 504 and 604 of component 2 may have the same (or similar) response functions, but be implemented differently (e.g., by using different types of components and/or different circuit layouts). In some implementations, each of instances 504 and 604 may include any suitable type of digital and/or analog circuitry. As noted above, in the present example, component 2 is an offset control circuit, and so instances 504 and 604 are different instances of an offset control circuit. However, it will be understood that the present disclosure is not limited to duplicating any specific component of the sensor 102.

In some implementations, instances 504 and 604 of component 2 may be formed in portions of the sensor die 108 that have different operating temperatures. For example, in some implementations, instance 504 may be formed in portion 110 of the sensor die 108, and instance 604 may be formed in portion 112 of the sensor die 108. As a result of the placement of instances 504 and 604 at different locations on the sensor die 108, the sensitivity of instances 504 and 604 may be affected to a different extent by increases in temperature (or a thermal gradient) of the sensor die 108.

Mixer 606 may include any suitable type of electronic circuitry that is configured to calculate the weighted average of the outputs of instances 502 and 602 of component 1. Mixer 608 may include any suitable type of electronic circuitry that is configured to calculate the weighted average of the output of instances 602 and 604 of component 2.

In operation, instance 502 of component 1 may receive the signal $S_{IN}$ and generate a signal $O_{11}$ based on the signal $S_{IN}$. Instance 502 may also receive the signal $S_{IN}$ and generate a signal $O_{12}$ based on the signal $S_{IN}$. The mixer 606 may mix the signals $O_{11}$ and $O_{12}$ to produce a mixed signal $O_1$. In some implementations, the mixed signal $O_1$ may be calculated in accordance with equation 10 below.

$$O_1 = \frac{(w_{11}o_{11} + w_{12}o_{12})}{2} \quad (10)$$

where $w_{11}$ and $w_{12}$ are weights for signals $O_{11}$ and $O_{12}$, respectively, and $w_{11}+w_{12}=1$.

Instance 504 of component 2 may receive the signal $O_1$ from mixer 606, and generate a signal $O_{21}$ based on the signal $O_{21}$. Instance 604 of component 2 may receive the signal $O_1$ from mixer 606, and generate a signal $O_{22}$ based on the signal $O_{22}$. The mixer 608 may mix the signals $O_{21}$ and $O_{22}$ to produce a mixed signal $O_2$. In some implementations, the mixed signal $O_2$ may be calculated om accordance with equation 11 below.

$$O_2 = \frac{(w_{21}o_{21} + w_{22}o_{22})}{2} \quad (11)$$

Where $w_{21}$ and $w_{22}$ are weights for signals $O_{21}$ and $O_{22}$, respectively, and $w_{21}+w_{22}=1$.

The processing circuitry 506 may receive the signal $O_2$ and generate the signal Vout based on the signal $O_2$. The present disclosure is not limited to any specific method for generating the signal Vout. The signal Vout may be any signal that is generated at least in part based on the outputs of one or more sensing elements that are part of the sensor 102. In some implementations, the signal Vout may be indicative, at least in part, of the level of the current Ip through the busbar 106.

Figure 7:
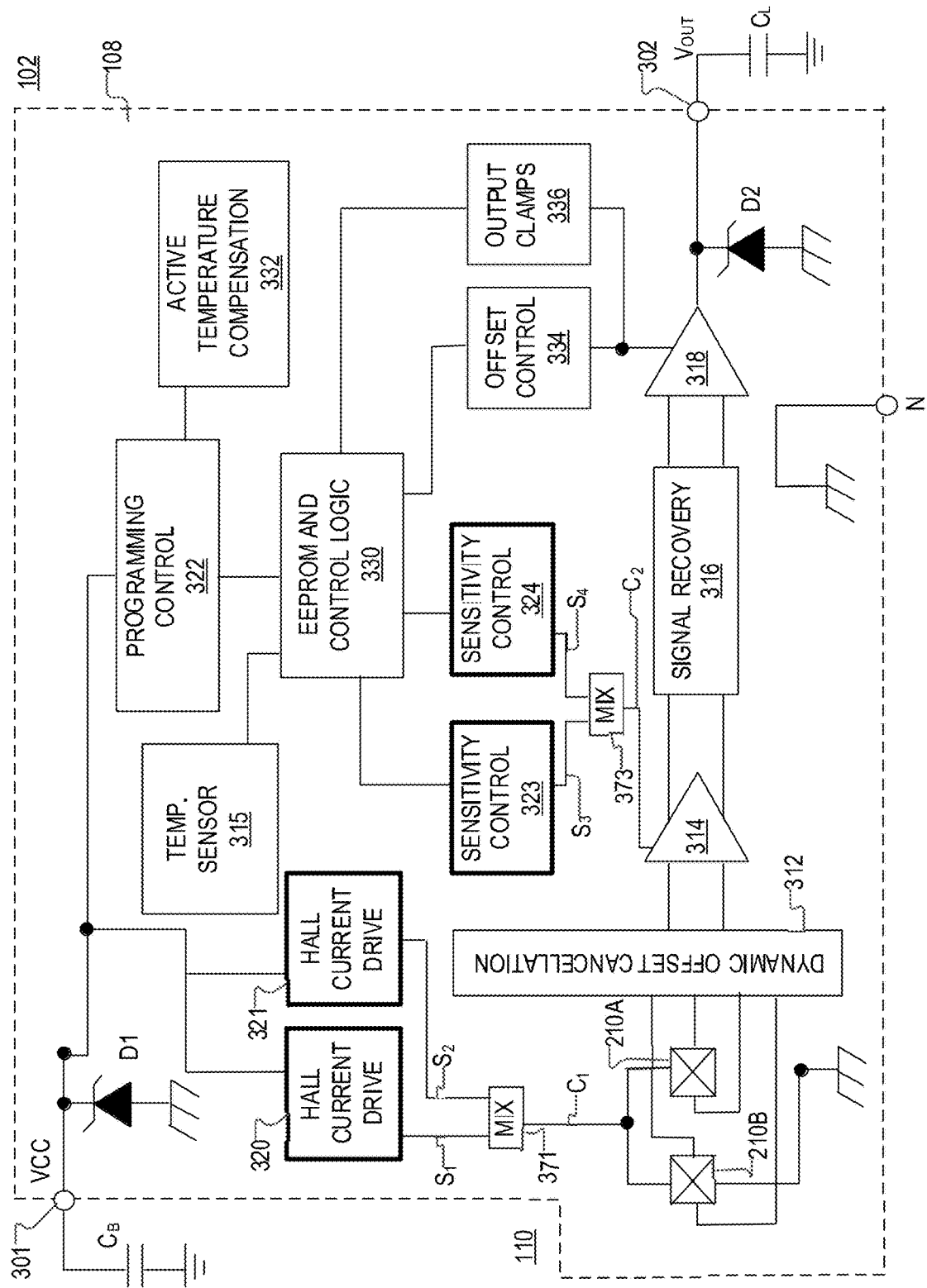
FIG. 7 is a circuit diagram of the current sensor of FIG. 1, according to aspects of the disclosure.

FIG. 7 is a circuit diagram of the sensor 102, in accordance with another implementation. In the example of FIG. 7, a hall current drive circuit and a sensitivity control circuit are duplicated to achieve increased resistance to TILE. In one respect, FIG. 7 provides an example in which the power source for magnetic field sensing elements is duplicated.

The sensor 102 may be configured to output a signal VOUT that is proportional to $\Delta B = B_R - B_L$ where $B_R$ represents magnetic field incident on one of the magnetic field sensing elements 210A-B and $B_L$ represents magnetic field incident on the other one of the magnetic field sensing elements 210A-B. The sensor output VOUT is also affected by the sensitivity, α, of the signal path and can be represented as follows:

$$VOUT = \alpha \times \Delta B \quad (12)$$

The relationship between the conductor current, such as the current Ip, to be measured and the differential field ΔB can be represented by a coupling coefficient, K(f) as follows:

$$\Delta B = K(f) \times Ip \quad (13)$$

It will be appreciated that coupling coefficient K(f) corresponds to coupling (e.g., transfer of energy, etc.) between a given current sensor and varies with frequency.

The sensor 102 may include a VCC (supply voltage) pin 301, a VOUT (output signal) pin 302. The VCC pin 301 is used for the input power supply or supply voltage for the current sensor 102. A bypass capacitor, CB, can be coupled between the VCC pin 301 and ground. The VCC pin 301 can also be used for programming the current sensor 102. The VOUT pin 302 is used for providing the output signal VOUT to circuits and systems (not shown) and can also be used for programming. An output load capacitance CL is coupled between the VOUT pin 302 and ground. The example current sensor 102 can include a first diode D1 coupled between the VCC pin 301 and chassis ground and a second diode D2 coupled between the VOUT pin 302 and chassis ground.

The driver circuits 320 and 321 may be configured to drive the magnetic field sensing elements 210A and 210B. In one respect, the driver circuits 320 and 321 may be thought of as different instances of a driving circuit for magnetic field sensing elements 210A and 210B. In some implementations, the driver circuits 320 and 321 may be identical electronic circuits that are configured to receive power from the VCC pin 301 and output a constant current signal. Alternatively, in some implementations, the driver circuits 320 and 321 may be different electronic circuits that are each configured to receive power from the VCC pin 301 and output a constant voltage signal. Although in the present example the sensing elements 210A and 210B are current driven, alternative implementations are possible in which the sensing elements 210A and 210B are voltage driven. In this regard, it will be understood that alternative implementations are possible in which at least one of the driver circuits 320 and 321 is configured to provide constant voltage, rather than constant current.

In some implementations, the driver circuits 320 and 321 may be formed in regions of the sensor die 108 that have different operating temperatures. For example, in some implementations, driver circuit 320 may be formed in portion 110 of the sensor die 108 (shown in FIG. 2) and driver circuit 321 may be formed in portion 112 of the sensor die 102 (shown in FIG. 2).

In some implementations, driver circuit 320 may be configured to output a constant current signal $S_1$ and driver circuit 321 may be configured to output a constant current signal $S_2$. A mixer 371 may receive a signal $S_1$ and $S_2$ and generate a signal $C_1$ based on the signals $S_1$ and $S_2$. The signal $C_1$ may be equal to a weighted average of signals $S_1$ and $S_2$. The signal $C_1$ may be used to drive the magnetic field sensing elements 210A and 210B. In some implementations, the signal $C_1$ may be calculated in accordance with equation 15 below:

$$C_1 = \frac{k_1 S_1 + K_2 S_2}{2} \quad (14)$$

where $k_1$ and $k_2$ are weights for signals $S_1$ and $S_2$, respectively, and $k_1+k_2=1$.

Magnetic field signals generated by the magnetic field sensing elements 210A and 210B are coupled to a dynamic offset cancellation circuit 312, which is further coupled to an amplifier 314. The amplifier 314 is configured to generate an amplified signal for coupling to the signal recovery circuit 316. Dynamic offset cancellation circuit 312 may take various forms including chopping circuitry and may function in conjunction with offset control circuit 334 to remove offset that can be associated with the magnetic field sensing elements 210A-B and/or the amplifier 314. For example, offset cancellation circuit 312 can include switches configurable to drive the magnetic field sensing elements (e.g., Hall plates) in two or more different directions such that selected drive and signal contact pairs are interchanged during each phase of the chopping clock signal and offset voltages of the different driving arrangements tend to cancel. A regulator (not shown) can be coupled between supply voltage VCC and ground and to the various components and sub-circuits of the sensor 102 to regulate the supply voltage.

A programming control circuit 322 is coupled between the VCC pin 301 and EEPROM and control logic circuit 330 to provide appropriate control to the EEPROM and control logic circuit. EEPROM and control logic circuit 330 determines any application-specific coding and can be erased and reprogrammed using a pulsed voltage.

Sensitivity control circuits 323 and 324 can be coupled to the amplifier 314 to generate and provide a sensitivity control signal C2 to the amplifier 314 to adjust a sensitivity and/or operating voltage of the amplifier 314. In one respect, sensitivity control circuits 323 and 324 may be thought of as different instances of a sensitivity control circuit for providing sensitivity control to the amplifier 314. In some implementations, the sensitivity control circuits 323 and 324 may be identical electronic circuits that are configured to receive a control signal from the EEPROM and control logic circuit 330 and generate respective signals $S_3$ and $S_4$ based on the received control signal. Alternatively, in some implementations, the sensitivity control circuits 323 and 324 may be different electronic circuits that are each configured to receive a control signal from the EEPROM and control logic circuit 330 and generate respective signals $S_3$ and $S_4$ based on the received control signal. In some implementations, the sensitivity control circuits 323 and 324 may be formed in regions of the sensor die 108 that have different operating temperatures. For example, in some implementations, sensitivity control circuit 323 may be formed in portion 110 of the sensor die 108 and sensitivity control circuit 324 may be formed in portion 112 of the sensor die 108.

In some implementations, sensitivity control circuit 323 may be configured to output a signal $S_3$ and sensitivity control circuit 324 may be configured to output a signal $S_4$. A mixer 373 may receive signals $S_3$ and $S_4$ and generate a signal $C_2$ based on the signals $S_3$ and $S_4$. The signal $C_2$ may be equal to a weighted average of signals $S_3$ and $S_4$. The signal $C_2$ may be used to adjust the sensitivity of amplifier 314. In some implementations, the signal $C_2$ may be calculated in accordance with equation 15 below:

$$C_2 = \frac{k_3 S_3 + k_4 S_4}{2} \quad (15)$$

where $k_3$ and $k_4$ are weights for signals $S_3$ and $S_4$, respectively, and $k_3+k_4=1$.

An active temperature compensation circuit 332 can be coupled to sensitivity control circuits 323 and 324 (e.g., via mixer 373), EEPROM and control logic circuit 330, and offset control circuit 334. The offset control circuit 334 can generate and provide an offset signal to a push/pull driver circuit 318 (which may be an amplifier) to adjust the sensitivity and/or operating voltage of the driver circuit 318. The active temperature compensation circuit 332 can acquire temperature data from EEPROM and control logic circuit 330 via a temperature sensor 315 and perform necessary calculations to compensate for temperature changes if needed. Output clamps circuit 336 can be coupled between the EEPROM and control logic circuit 330 and the driver circuit 318 to limit the output voltage and for diagnostic purposes.

Figure 8:
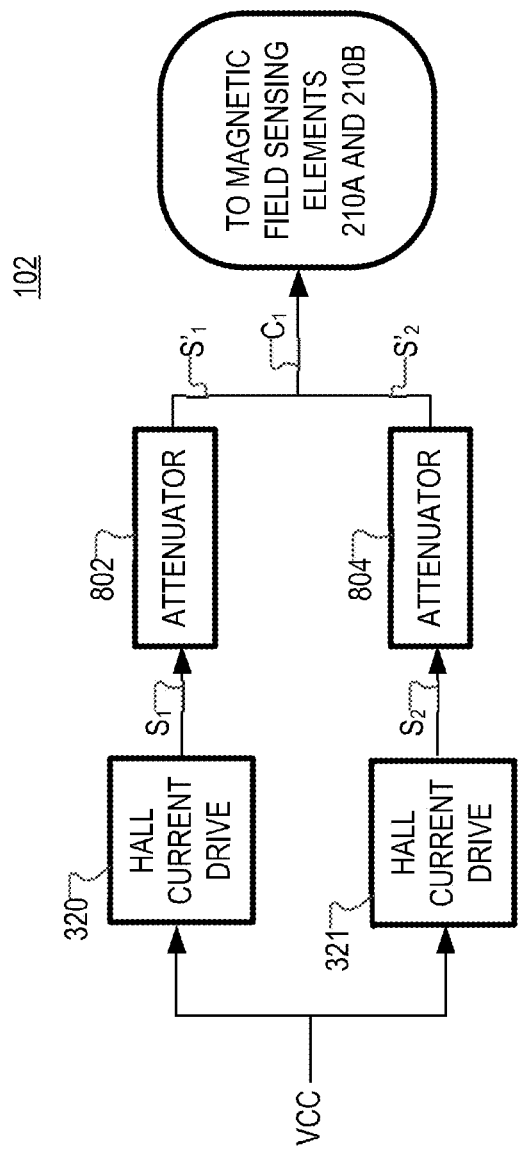
FIG. 8 is a diagram of an example of a mixing circuitry, according to aspects of the disclosure.

Although in the example of FIG. 7, the outputs of driver circuits 320 and 321 are combined by using a mixer, alternative implementations are possible in which the outputs of driver circuits 320 and 321 may be combined by using a pair of attenuators. For example, as illustrated in FIG. 8, the mixer 371 may be replaced with attenuators 802 and 804. Attenuator 802 may include one or more of a resistor, a potentiometer, and/or any other suitable type of attenuator circuit. Attenuator 804 may include one or more of a resistor, a potentiometer, and/or any suitable type of attenuator circuit. The attenuator 802 may be configured to receive signal S1 and generate a signal S'1 based on the signal S1. Attenuator 804 may be configured to receive signal S2 and generate a signal S'2. The signals S'1 and S'2 may then be combined (e.g., added up) to produce the signal C1, as shown. In some implementations, signals S'1, S'2, and C'1 may be generated in accordance with equations 16-18:

$$S'_1 = k_1 S_1 \qquad (16)$$

$$S'_2 = k_2 S_2 \qquad (17)$$

$$C_1 = S'_1 + S'_2 \qquad (18)$$

where $k_1$ and $k_2$ are weights for signals $S_1$ and $S_2$, respectively, and $k_1+k_2=1$.

In the examples of FIGS. 6-7 either mixers (e.g., mixers 606 and 608) or attenuators 802-804 are used to compute the weighted average of signals that are output from different instances of the same component. Under the nomenclature of the present disclosure, any of the mixers (e.g., mixers 606 and 608) shown in FIG. 6 and the combination of attenuators shown in FIG. 7 are considered to be examples of "mixing circuitry". However, it will be understood that the present disclosure is not limited to any specific implementation of a mixing circuitry. For example, in some implementations the mixing circuitry may be integrated into the components whose outputs are mixed. As used throughout the disclosure, the term "mixing circuitry" shall refer to any electronic circuitry that is at least in part configured to generate the weighted average of two or more signals.

Figure 9:
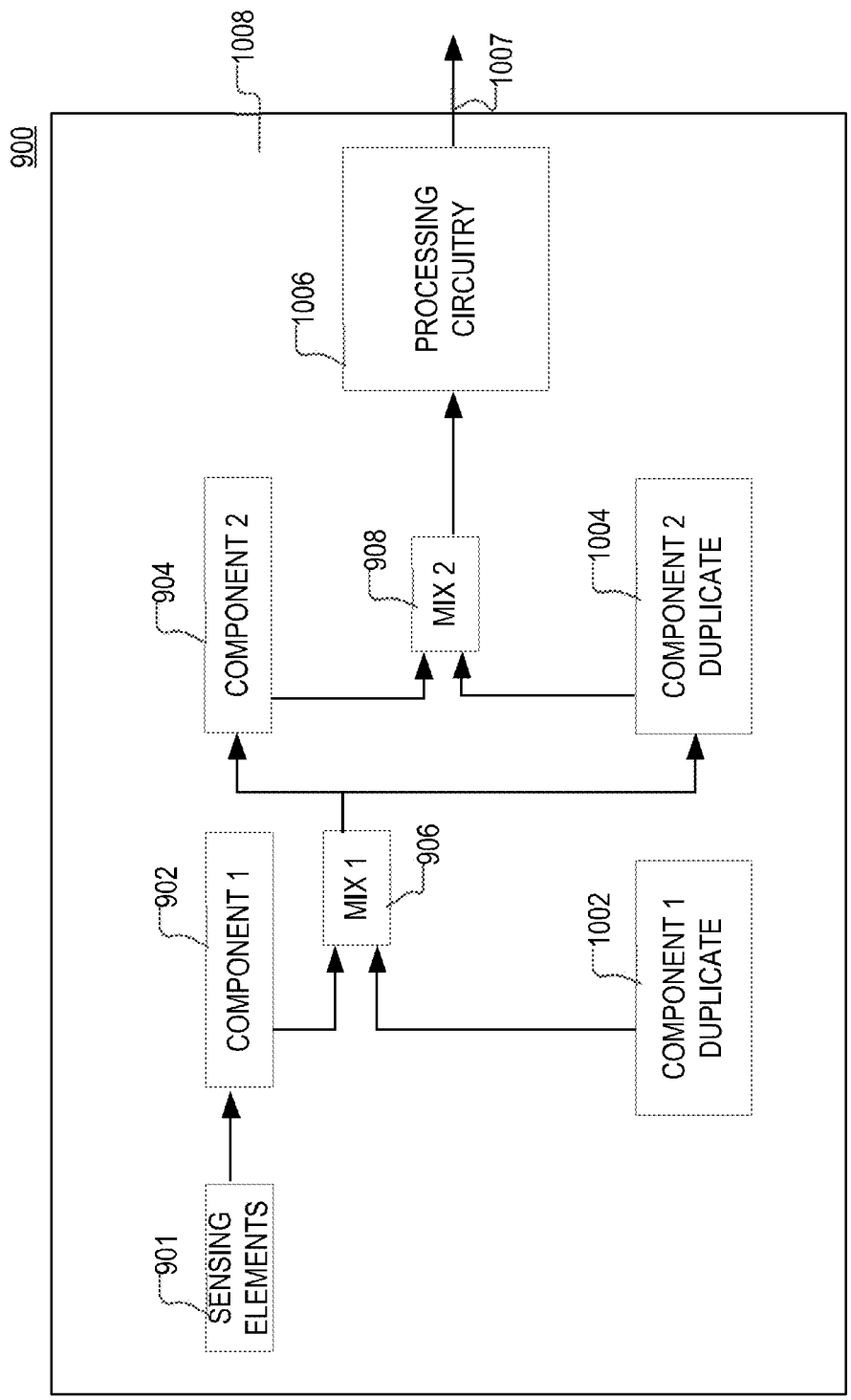
FIG. 9 is a schematic diagram of a sensor, according to aspects of the disclosure.

FIG. 9 is a schematic diagram of a sensor 900, according to aspects of the disclosure. The sensor 900 may include at least one of a light sensor, a pressure sensor, a temperature sensor, a chemical compound sensor (e.g., an oxygen sensor), a vibration sensor, a humidity sensor, and/or any other suitable type of sensor. The sensor 900 may have an architecture that is similar to the architecture discussed with respect to FIG. 6. In one respect, FIG. 9 is provided to illustrate that the concepts and ideas provided in the disclosure are not limited to being applied in current sensors only, and they can be applied to any sensor that is subject to a thermal gradient either due to its construction or due the operating environment where it is used.

The sensor 900 may include a sensor die 1008. Formed on the sensor die 1008 may be one or more sensing elements 901, an instance 902 of a first component (hereinafter "component 1"), an instance 1002 of component 1, an instance 904 of a second component (hereinafter "component 2"), an instance 1004 of the second component, a mixer 906, a mixer 908, and a processing circuitry 1006. The sensing elements 901 may include one or more magnetic field sensing elements, light sensing elements, pressure sensing elements, vibration sensing elements, humidity sensing elements, and/or any other suitable type of sensing elements. The sensor die 1008 may include a silicon die, a sapphire die, and/or any other suitable type of substrate. The processing circuitry 1006 may include any suitable type of digital or analog circuitry. In some implementations, the processing circuitry 1006 may include an application-specific circuit, an arithmetic and logic unit, a CORDIC processor, a general-purpose processor, a special-purpose processor, and/or any other suitable type of processing circuitry.

In one example, instances 902 and 1002 of component 1 may be identical electronic circuits. In another example, instances 902 and 1002 of component 1 and component 2 may be different electronic circuits that perform the same function—for instance, instances 902 and 1002 of component 1 may have the same (or similar) response functions, but be implemented differently (e.g., by using different types of components and/or different circuit layouts). In some implementations, each of instances 902 and 1002 may include any suitable type of digital and/or analog circuitry. In some implementations, instances 902 and 1002 of component 1 may be formed in portions of the sensor die that have different operating temperatures.

In one example, instances 904 and 1004 of component 2 may be identical electronic circuits. In another example, instances 904 and 1004 of component 2 may be different electronic circuits that perform the same function—for instance, instances 904 and 1004 of component 2 may have the same (or similar) response functions, but be implemented differently (e.g., by using different types of components and/or different circuit layouts). In some implementations, each of instances 904 and 1002 may include any suitable type of digital and/or analog circuitry. In some implementations, instances 904 and 1004 of component 2 may be formed in different portions of the sensor die that have different operating temperatures.

Mixer 906 may include any suitable type of electronic circuitry that is configured to calculate the weighted average of the outputs of instances 902 and 1002 of component 1. Mixer 908 may include any suitable type of electronic circuitry that is configured to calculate the weighted average of the outputs of instances 904 and 1004 of component 2. The output of mixer 906 may be provided to instances 904 and 1004 of component 2. The output of mixer 908 may be provided to the processing circuitry 1006. The processing circuitry 1006 may generate an output signal 1007 that is indicative of the level of the stimulus that is being sensed by sensing elements 901 (e.g., magnetic flux density, heat, pressure, etc.). The signal 1007 may be generated based at least in part on the output of mixer 908.

As used throughout the disclosure, the term "duplicating a component" shall be interpreted as providing two or more instances of the component. Although in the examples of FIGS. 6-9 different components in a signal path are duplicated by providing two instances of each component, alternative implementations are possible in which any of the components is duplicated by providing three or more instances of the component, and mixing the outputs of the instances by determining their weighted average. The phrase "determining a weighted average of a first signal and a second signal" shall be interpreted as "determining a weighted average of a set of signals that includes the first signal and the second signal". The set of signals may or may not include other signals in addition to the first signal and the second signal.

It will be appreciated by those of ordinary skill in the art that while a substrate (e.g., a semiconductor substrate) is described as "supporting" the magnetic field sensing element, the element may be disposed "over" or "on" the active semiconductor surface, or may be formed "in" or "as part of" the semiconductor substrate, depending upon the type of magnetic field sensing element. For simplicity of explanation, while the embodiments described herein may utilize any suitable type of magnetic field sensing elements, such elements will be described here as being supported by the substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor may be used in combination with a back-biased or other magnet, and a magnetic field sensor that senses a magnetic field density of a magnetic field.

As used herein, the term "target" is used to describe an object to be sensed or detected by a magnetic field sensor or magnetic field sensing element. A target may be ferromagnetic or magnetic.

According to the present disclosure, a magnetic field sensing element can include one or more magnetic field sensing elements, such as Hall effect elements, magnetoresistance elements, or magnetoresistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims.

The invention claimed is:

1. A current sensor comprising:
a substrate;
a conductor that is disposed on or adjacent to the substrate;
one or more sensing elements that are formed on the substrate, the one or more sensing elements being configured to generate one or more first signals in response to a magnetic field that is associated with the conductor; and
electronic circuitry that is formed on the substrate, the electronic circuitry being configured to generate a second signal based on the one or more first signals, the second signal being indicative of a level of electrical current through the conductor,
wherein the electronic circuitry includes a first instance of a component, a second instance of the component, and mixing circuitry that is configured to mix an output of the first instance with an output of the second instance to produce a mixed signal, the mixing circuitry being arranged to provide the mixed signal to at least one of the sensing elements or a second component of the electronic circuitry, and
wherein the first instance of the component is formed in a first portion of the substrate that is adjacent to the conductor and the second instance of the component is formed in a second portion of the substrate that is situated further apart from the conductor than the first portion.

2. The current sensor of claim 1, wherein the first portion of the substrate has a higher operating temperature than the second portion of the substrate.

3. The current sensor of claim 1, wherein the component includes a driver for any of the one or more sensing elements.

4. The current sensor of claim 1, wherein the component includes a sensitivity control unit.

5. The current sensor of claim 1, wherein the component includes an offset control unit.

6. The current sensor of claim 1, wherein the conductor includes a busbar.

7. The current sensor of claim 1, wherein the mixing circuitry is separate of the first instance of the component and the second component.

8. The current sensor of claim 1, wherein the mixing circuitry is configured to generate the mixed signal by calculating a weighted average of the output of the first instance and the output of the second instance.

9. The current sensor of claim 8, wherein the output of the first instance is weighted by a first weight value and the output of the second instance is weighted by a second weight value.

10. The current sensor of claim 1, wherein each of the sensing elements includes at least one of a giant magnetoresistor (GMR), a tunnel magnetoresistor (TMR), an anisotropic magneto resistor (AMR), a Hall plate, or a fluxgate.

11. A current sensor comprising:
a substrate;
a conductor that is disposed on or adjacent to the substrate;
one or more sensing elements that are formed on the substrate, the one or more sensing elements configured to generate one or more first signals in response to a magnetic field that is associated with the conductor; and
electronic circuitry that is formed on the substrate, the electronic circuitry being configured to generate a second signal based on the one or more first signals, the second signal being indicative of a level of electrical current through the conductor,
wherein the electronic circuitry includes a first instance of a component, a second instance of the component, and the electronic circuitry is configured to mix an output of the first instance with an output of the second instance to produce a mixed signal and use the mixed signal in generating the second signal.

12. The current sensor of claim 11, wherein the first instance of the component is formed in a first portion of the substrate that is adjacent to the conductor and the second instance of the component is formed in a second portion of the substrate that is situated further apart from the conductor than the first portion.

13. The current sensor of claim 11, wherein the first instance of the component is formed in a first portion of the substrate and the second instance of the component is formed in a second portion of the substrate that has a lower operating temperature than the first portion.

14. The current sensor of claim 11, wherein the component includes a driver for any of the sensing elements.

15. The current sensor of claim 11, wherein the component includes a sensitivity control unit.

16. The current sensor of claim 11, wherein the component includes an offset control unit.

17. The current sensor of claim 11, wherein mixing the output of the first instance with the output of the second instance includes calculating a weighted average of the output of the first instance and the output of the second instance.

18. The current sensor of claim 17, wherein the output of the first instance is weighted by a first weight value and the output of the second instance is weighted by a second weight value.

19. The current sensor of claim 11, wherein each of the sensing elements includes at least one of a giant magnetoresistor (GMR), a tunnel magnetoresistor (TMR), an anisotropic magneto resistor (AMR), a Hall plate, or a fluxgate.

20. A sensor comprising:
a substrate that is subjected to a temperature gradient during operation of the sensor;
one or more sensing elements that are formed on the substrate, the one or more sensing elements configured to generate one or more first signals in response to a stimulus; and
electronic circuitry that is formed on the substrate, the electronic circuitry being configured to generate a second signal based on the one or more first signals, the second signal being indicative of a level of the stimulus, wherein the electronic circuitry includes a first instance of a component, a second instance of the component, and the electronic circuitry is configured to mix an output of the first instance with an output of the second instance to produce a mixed signal and use the mixed signal in generating the second signal.

21. The sensor of claim 20, wherein the first instance of the component is formed in a first portion of the substrate and the second instance of the component is formed in a second portion of the substrate that has a lower operating temperature than the first portion.

22. The sensor of claim 21, wherein mixing the output of the first instance with the output of the second instance includes calculating a weighted average of the output of the first instance and the output of the second instance.

23. The sensor of claim 22, wherein the output of the first instance is weighted by a first weight value and the output of the second instance is weighted by a second weight value.

24. The sensor of claim 20, wherein the component includes a driver for at least one of the sensing elements.

25. The sensor of claim 20, wherein each of the sensing elements includes one of a magnetic field sensing element, a light sensing element, a pressure sensing element, a temperature sensing element, or a humidity sensing element.

* * * * *